United States Patent [19]

Weglein

[11] 4,103,263
[45] Jul. 25, 1978

[54] TRIPLE-TRANSIT-SUPPRESSED BULK ACOUSTIC WAVE DELAY LINE

[75] Inventor: Rolf D. Weglein, Los Angeles, Calif.

[73] Assignee: Hughes Aircraft Company, Culver City, Calif.

[21] Appl. No.: 785,374

[22] Filed: Apr. 7, 1977

[51] Int. Cl.² .............................................. H03H 9/30
[52] U.S. Cl. ..................................... 333/30 R; 333/72
[58] Field of Search ...................... 333/30 R, 29, 72; 310/328, 333

[56] References Cited

U.S. PATENT DOCUMENTS 4,016,512   4/1977   Wauk .................................. 333/30 R Primary Examiner—Alfred E. Smith
Assistant Examiner—Marvin Nussbaum
Attorney, Agent, or Firm—John Holtrichter, Jr.; W. H. MacAllister

[57] ABSTRACT

A mode-converting type bulk acoustic wave delay line adapted to suppress triple transit signals and provide response tailoring, the device including a body of acoustic wave supporting material with at least one mode-converting planar surface capable of reversably converting longitudinal wave mode acoustic energy to shear wave mode acoustic energy, the device also including an attenuating structure disposed on the mode-converting planar surface for absorbing a predetermined amount of propagating shear wave mode energy and thereby increase insertion loss.

3 Claims, 4 Drawing Figures

4,103,263

TRIPLE-TRANSIT-SUPPRESSED BULK ACOUSTIC WAVE DELAY LINE

BACKGROUND OF THE INVENTION

The background of the invention will be set forth in two parts.

1. Field of the Invention

This invention relates to delay lines, and more particularly to bulk acoustic wave delay lines.

2. Description of the Prior Art

The usefulness of propagating elastic wave energy in solids has been known for many years. Utilizing this technology, such devices which store and delay signals have been developed to a relatively high degree. Many texts are presently available which thoroughly describe the history and advancements of this art, such as, for example, "Ultrasonic Methods in Solid State Physics" Rohn Truell, Charles Elbaum and Bruce B. Chick, Academic Press, 1969.

Probably the greatest interest in the field of bulk wave devices has been in bulk acoustic wave delay lines. Unlike surface acoustic wave delay lines in which most of the energy propagating along an elastic surface is converted to electromagnetic wave energy upon reaching a state-of-the-art transducer, only about 10% of the propagating bulk wave energy is converted at an output transducer, the rest being reflected back toward the input transducer. This relatively strong reflected wave is again reflected at the input transducer and is incident on the output transducer to produce a relatively strong signal known generally as the triple-transit signal.

Although there was at first much interest in bulk acoustic wave devices because they are more adaptable for operation in the multi-gigahertz range as compared to surface acoustic wave devices (usually limited to about 500 MHz), the problem of the triple-transit signal has caused a decrease in such interest.

In attempts to overcome spurious multiple transit signal problems resulting from reflections from the crystal end faces, it has been found that these unwanted signals are attenuated or suppressed through careful design utilizing several effects:

A. Attentuation — if the main signal is attenuated $\alpha_T$ dB, then the triple transit signal is attenuated an additional $2\alpha_T$ dB.

B. Diffraction loss due - to spreading.

C. Tilting the end faces of the crystal to cause phase cancellation and beam walk-off.

D. Acoustic matching of the transducer in order to reduce the acoustic reflection.

Generally, all these effects are utilized to some extent in order to obtain what has been considered to be a reasonable value of triple-transit suppression, where triple-transit suppression is defined as the ratio of the main delayed signal to the triple-transit spurious signal.

Attenuation is important in order to reduce this echo problem because it more greatly affects the multiple path triple-transit echo signal than the single transit main signal. However, the increase of attenuation per unit time of the propagating energy in the solid is extremely frequency dependent. That is, the attenuation $\alpha$ in dB per microsecond is proportional to $f^2$, where $f$ is the frequency of the propagating acoustic wave energy. Thus, a 5 dB attenuation of this type at 5 GHz will be approximately 20 dB at 10 GHz. This $f^2$ dependence is more completely discussed in such articles as, "On the Absorption of Sound in Solids" by A. Akhieser in *The Journal of Physics* (USSR), Vol. 1, page 277 (1939), and in, "Absorption of Sound in Insulators" by T. O. Woodruff and H. Ehrenreich, in Physical Review, Vol. 123, page 1553 (1961).

Several techniques have been developed in order to lessen the overall frequency dependent attenuation and thereby increase the bandwidth of the device.

A technique has been developed in an effort to reduce the overall dependent attenuation. This scheme utilizes mode converting surfaces which convert a longitudinal or compressional bulk wave to a shear or transverse bulk wave. This technique uses the well-known principle that longitudinal waves can be converted to shear waves by reflection off of a free surface disposed at a predetermined angle with respect to the incident wave. Delay lines utilizing this scheme use a transducer to generate and receive the longitudinal waves while the substantial part of the propagating acoustic wave energy traverses the device in the shear wave mode. This scheme, along with the cooling technique, substantially reduces the $f^2$ bandwidth problem but, as mentioned before, increases the triple-transit problem. It should, therefore, be evident that a new technique which will maintain a relatively wide bandwidth characteristic in a bulk delay line while providing a relatively high triple transit signal suppression would constitute a significant advancement in the art.

SUMMARY OF THE INVENTION

In view of the foregoing factors and conditions characteristic of the prior art, it is a primary object of the present invention to provide an improved bulk acoustic wave delay line.

Another object of the present invention is to provide a relatively wide band bulk acoustic wave delay line having relatively overall low attenuation with a high degree of triple-transit signal energy suppression.

In accordance with an embodiment of the present invention, a triple-transit-suppressed bulk acoustic wave delay line includes a body of material capable of supporting propagating longitudinal and shear wave modes of acoustic energy, the body having at least one longitudinal-shear wave mode converting wall defining a relatively long but relatively low-attenuation per unit time shear wave mode propagation path with the body, angularly disposed with respect to the plane of the mode converting wall. A transducer is disposed on the body for converting electromagnetic wave energy to acoustic wave energy, and the converse thereof, and for directing and receiving propagating longitudinal wave mode acoustic energy to and from the mode converting wall along relatively short but relatively higher attenuation per unit time longitudinal wave mode propagation paths within the body, angularly disposed with respect to the plane of the mode converting wall and to the shear wave mode propagation path. The invention also includes shear wave mode attenuation means disposed on the mode converting wall in the shear wave mode propagation path for absorbing a predetermined amount of propagating shear wave mode energy and thereby increase insertion loss.

The features of the present invention which are believed to be novel are set forth with particularity in the appended claims. The present invention, both as to its organization and manner of operation, together with further objects and advantages thereof, may best be understood by making reference to the following description taken in conjunction with the accompanying drawings in which like reference characters refer to like elements in the several views.

DESCRIPTION OF THE PREFERRED EMBODIMENTS

Figure 1:
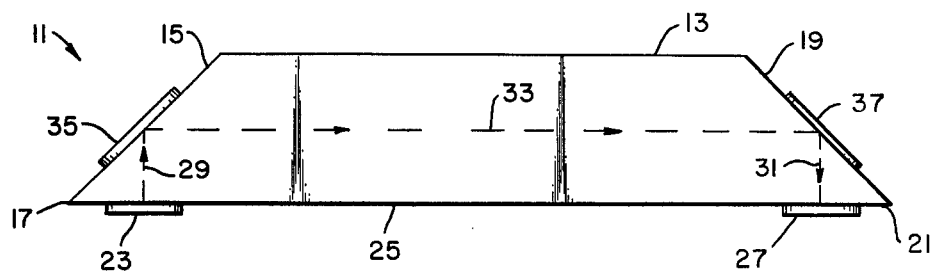
FIG. 1 is a schematic view of a triple-transit-suppressed bulk acoustic wave delay line constructed in accordance with the present invention.

Referring now to the drawing and more particularly to FIG. 1, there is shown a triple-transit-suppressed bulk acoustic wave delay line 11 with a body 13 of a material such as magnesium aluminate spinel (spinel), which is capable of supporting propagating longitudinal and shear wave modes of acoustic energy. In this embodiment, the body 13 includes a first longitudinal-shear wave mode converting wall 15 at a first end 17 and a second such wall 19 at the opposite or second end 21 of the body. A conventional input transducer 23 is mounted on a flat surface 25 adjacent the first end 17, while a conventional output transducer 27 is mounted by conventional means to the surface 25 adjacent the second end 21 of the body 13.

The input transducer 23 converts electromagnetic wave energy to acoustic wave energy, while the output transducer 27 does the converse thereof. In operation, the input and output transducers, respectively direct and receive longitudinal wave mode acoustic energy along relatively short paths 29 and 31, which paths have a relatively higher attenuation per unit time characteristic. Such longitudinal wave mode energy incident on the first mode converting wall 15 is converted to shear wave mode energy propagating along a longer path 33. However, the shear wave mode path has a relatively lower attenuation per unit time characteristic.

In accordance with the present invention, shear wave mode attenuation pads or film discs 325 and 37 are attached or deposited by conventional means to the respective mode converting walls 15 and 19 in positions to intercept the shear wave mode energy and absorb an amount of such energy determined by the thickness and type of material sused as an absorber. Preferably, the absorbing discs have a characteristic to match and, therefore, efficiently absorb the shear wave mode energy. One example of such a material is ZnO. The absorbing films act to provide a desired amount of propagation loss and thereby increase triple transit suppression.

Figure 2:
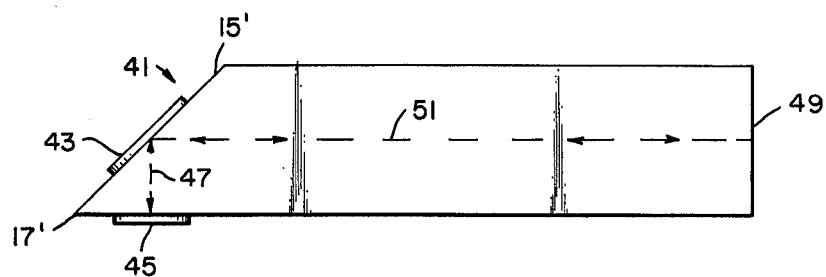
FIGS. 2 and 3 illustrate additional embodiments of the present invention.

FIG. 2 illustrates a similar opening device 41 wherein a single absorption film 43 is provided at the end 15' to absorb shear wave mode energy generated and received by a single input/output transducer 45. It can be seen that, again, the longitudinal wave mode path 47 is shorter than the shear wave mode energy propagating to and reflected from a perpendicular reflecting end wall 49 along a longitudinal path 51.

Figure 3:
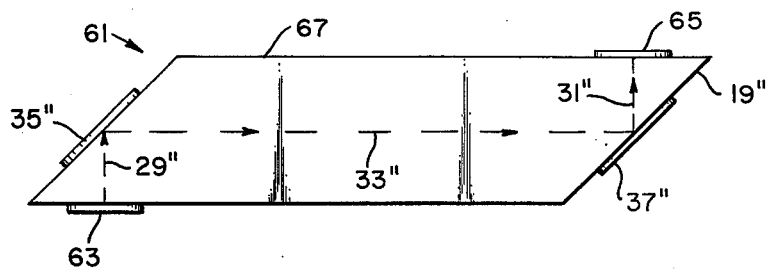

In accordance with still another embodiment 61 of the invention shown in FIG. 3, the input and output transducers 63 and 65, respectively, are postioned on opposite sides of the device by virtue of the parallelpiped configuration of the body 67. In all other respects, the delay line functions similarly to that first described embodiment of FIG. 1.

It should be understood that the film thickness may be tailored to provide a desired amount of propagation loss at desired frequencies. This is by virtue of the fact that beam diffraction is frequency dependent. The procedure of adjusting the film geometry may be accomplished by such techniques as resist masking and/or ion etching, for example. This procedure can be done "on line", that is, while the performance of the device is being measured.

Figure 4:
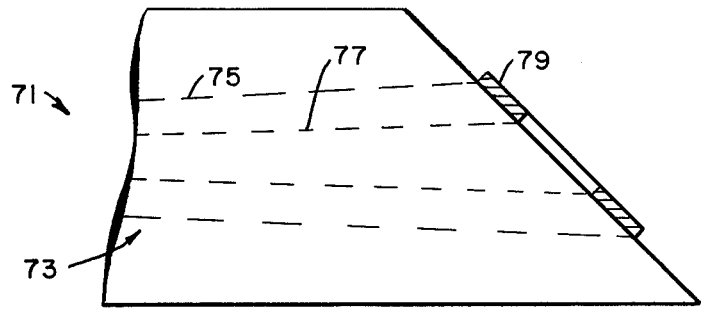
FIG. 4 is an enlarged view of a portion of a triple-transit-suppressed bulk acoustic wave delay line constructed in accordance with still another embodiment of the present invention.

A configuration 21 which lends itself to such tailoring, is illustrated in FIG. 4. Here, with a given launching aperture, the beam 73 is diffracted to a longer width 75 at lower frequencies where the propagation loss is low, as compared to a smaller beam width 77 at higher frequencies, where the propagation loss is higher. Consequently, an annular absorption layer 79 concentric with the arriving acoustic beam 73 will produce the effect of attenuating the larger, lower frequency beam more.

From the foregoing, it should be evident that the present invention provides a new and advantageous triple-transit-suppressed bulk acoustic wave delay line that is adapted to allow response tailoring and which is incorporated in a mode-converting configuration having at least one longitudinal/shear wave mode converting wall.

It should be understood that although certain specific materials and embodiments have been described in detail, other materials and embodiments exhibiting similar characteristics and following the teachings of the invention may be utilized and constructed within the scope and contemplation of the invention.

What is claimed is:

1. A triple transit signal-suppressed bulk acoustic wave delay line comprising:

a body of material capable of supporting propagating longitudinal and shear wave modes of acoustic energy, said body including at least one longitudinal-shear wave mode converting wall defining a relatively long but relatively low-attenuation per unit time, shear wave mode propagation path within said body angularly disposed with respect to the plane of said mode converting wall;

transducer means disposed on said body for converting electromagnetic wave energy to acoustic wave energy and the converse thereof, and for directing and receiving propagating longitudinal wave mode acoustic energy to and from said mode converting wall along relatively short but relatively higher attenuation per unit time, longitudinal wave mode propagation paths within said body angularly disposed with respect to said plane of said mode converting wall and to said shear wave mode propagation path; and shear wave mode attenuation means in the form of a disc is disposed on said mode converting wall in said shear wave mode propagation path for absorbing a predetermined amount of propagating shear wave mode energy and thereby increase insertion loss.

2. The delay line according to claim 1, wherein said shear wave mode attenuation means is in the form of an annular disc.

3. The delay line according to claim 1, wherein said shear wave mode attenuation means is ZnO.

* * * * *